US007899570B2

(12) United States Patent
Ortleb et al.

(10) Patent No.: US 7,899,570 B2
(45) Date of Patent: Mar. 1, 2011

(54) ADVANCED AUTOMATIC DEPOSITION PROFILE TARGETING AND CONTROL BY APPLYING ADVANCED POLISH ENDPOINT SYSTEM FEEDBACK

(75) Inventors: Thomas Ortleb, Dresden (DE); Markus Nopper, Dresden (DE); Thomas Roessler, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 202 days.

(21) Appl. No.: 12/038,327

(22) Filed: Feb. 27, 2008

(65) Prior Publication Data

US 2009/0036029 A1   Feb. 5, 2009

(30) Foreign Application Priority Data

Jul. 31, 2007   (DE) .................. 10 2007 035 833

(51) Int. Cl.
  G06F 19/00   (2006.01)
  B24B 49/12   (2006.01)
(52) U.S. Cl. ..................... 700/121; 700/108; 451/5
(58) Field of Classification Search .............. 700/108, 700/121; 702/97, 170; 451/5, 6, 10; 438/690, 438/691, 692
  See application file for complete search history.

(56) References Cited

U.S. PATENT DOCUMENTS

| | | | | |
|---|---|---|---|---|
| 5,665,199 A * | 9/1997 | Sahota et al. ................. 438/14 |
| 6,004,187 A * | 12/1999 | Nyui et al. ..................... 451/5 |
| 6,030,887 A * | 2/2000 | Desai et al. ................... 438/507 |
| 6,171,174 B1 * | 1/2001 | Campbell et al. ............... 451/5 |
| 6,271,047 B1 * | 8/2001 | Ushio et al. .................. 438/14 |
| 6,276,989 B1 * | 8/2001 | Campbell et al. .............. 451/10 |
| 6,440,186 B1 * | 8/2002 | Sakai et al. ................... 51/308 |
| 6,503,361 B1 * | 1/2003 | Nyui et al. ................ 156/345.13 |
| 6,540,591 B1 * | 4/2003 | Pasadyn et al. ............... 451/41 |
| 6,589,871 B2 * | 7/2003 | Yamaguchi et al. .......... 438/691 |
| 6,620,031 B2 * | 9/2003 | Renteln ........................ 451/41 |
| 6,630,360 B2 * | 10/2003 | Christian et al. ................. 438/5 |
| 6,633,831 B2 * | 10/2003 | Nikoonahad et al. ......... 702/155 |
| 6,912,437 B2 * | 6/2005 | Chong et al. ................. 700/121 |
| 6,914,000 B2 * | 7/2005 | Kamada ..................... 438/692 |
| 7,008,875 B2 * | 3/2006 | Birang et al. ................ 438/692 |
| 7,071,106 B2 * | 7/2006 | Chuang et al. ............... 438/690 |
| 7,118,451 B2 * | 10/2006 | Chen et al. ..................... 451/8 |
| 7,201,936 B2 * | 4/2007 | Schwarm et al. ............... 427/8 |
| 2003/0092261 A1 | 5/2003 | Kondo et al. ................ 438/638 |
| 2003/0162385 A1 | 8/2003 | Preusse et al. .............. 438/633 |
| 2003/0220708 A1 * | 11/2003 | Sahin et al. ................. 700/121 |
| 2004/0203321 A1 * | 10/2004 | Tsuchiyama et al. ............ 451/6 |
| 2008/0146119 A1 * | 6/2008 | Sasaki et al. .................... 451/5 |
| 2008/0183312 A1 * | 7/2008 | Funk et al. .................... 700/45 |
| 2008/0183411 A1 * | 7/2008 | Funk et al. .................... 702/84 |
| 2008/0183412 A1 * | 7/2008 | Funk et al. .................... 702/97 |
| 2008/0183413 A1 * | 7/2008 | Deshpande et al. ............ 702/99 |

OTHER PUBLICATIONS

Translation of Official Communication from German Patent Office for German Patent Application No. 10 2007 035 833.6-33 dated Apr. 9, 2008.

* cited by examiner

*Primary Examiner* — Charles R Kasenge
(74) *Attorney, Agent, or Firm* — Williams, Morgan & Amerson, P.C.

(57) ABSTRACT

The present disclosure relates to automatic deposition profile targeting with a combined deposition/polishing apparatus which obtains matching deposition and subsequent polishing profiles by use of feedback data from an advanced polish endpoint system in an advanced process control system.

18 Claims, 5 Drawing Sheets

ADVANCED AUTOMATIC DEPOSITION PROFILE TARGETING AND CONTROL BY APPLYING ADVANCED POLISH ENDPOINT SYSTEM FEEDBACK

BACKGROUND OF THE INVENTION

1. Field of the Invention

The present disclosure relates to a method of automatic deposition profile targeting and control using feedback data from an advanced polish endpoint system, and, more particularly, to automatic deposition profile targeting with a combined deposition/polishing apparatus which obtains matching deposition and subsequent polishing profiles.

2. Description of the Related Art

The demand for an improved efficiency of manufacturing processes of highly integrated circuits in order to save manufacturing costs, as well as the demand for products having a higher performance, led to a new material deposition and removal technique. For example, conventionally, a layer of material is deposited by, for instance, vapor deposition or sputtering. Subsequently, the deposited material is patterned with photoresist and etching technologies. There are, however, cases where it is more efficient not to use photoresist patterning techniques and classical anisotropic and unisotropic etching technologies.

One of these cases is the copper damascene integration technique that has been developed in response to the demand for higher integration, higher clock frequencies and smaller power consumption in microprocessor technology. Since copper is a better conductor than the usually used aluminum, chips using the copper wiring technology may have smaller metal components and use less energy to pass electricity through them. These effects lead to a high performance of the integrated circuits.

The transition from aluminum to copper required, however, significant developments in fabrication techniques. Since volatile copper compounds do not exist, copper cannot be readily patterned by photoresist masking and plasma etching such that a new technology for patterning copper had to be developed, which is known as a copper damascene process. In this process, the underlying silicon dioxide insulating layer is patterned with open trenches where the conductor should be filled in. A thick coating of copper that significantly overfills the trenches is deposited on the insulator and chemical mechanical planarization (CMP), also known as chemical mechanical polishing, is used to remove the excess copper to the top level of the trench.

Since copper may not be deposited efficiently by physical vapor deposition, for example, by sputter deposition, with a layer thickness on the order of 1 μm and more, electroplating of copper and copper alloys is the currently preferred deposition method of forming metallization layers. Although, electroplating of copper is a well-established technique, reliably establishing copper over large diameter substrates having a patterned surface including trenches and wires is a challenging task for process engineers. At a first glance, it appears to be advantageous that metal thickness profile across the substrate surface may be formed as uniformly as possible. However, post-plating processes may require a differently shaped profile to assure proper device functionality of the completed integrated circuits. Currently, there is no effective copper dry etching method because of problems removing low volatility copper compounds. Presently, chemical mechanical polishing (CMP) is used for removing excess copper. Since the CMP process is per se a highly complex process frequently exhibiting an intrinsic process non-uniformity, i.e., a non-uniform removal rate across the substrate surface, it may be preferable to adapt the metal thickness profile to the post-plating process to achieve in total an improved process uniformity after completion of the post-plating process. Therefore, electroplating tools are often configured so as to allow a variation of the metal profile, for instance, by using multiple anodes on an electrochemical deposition (ECD) copper plating tool.

In conclusion, in copper damascene integration schemes for an optimal chemical mechanical polishing process, a metal deposition with corresponding plating profile is necessary for process stabilization and optimization. That means that, in different zones on a wafer, there is required deposition of different metal thicknesses. The deposition tool must be capable to actively influence the deposition profile, e.g., using multiple anodes on an ECD copper plating tool. The goal for optimal deposition processes is to match the inverse polish removal profile and to actively compensate influences like consumable aging and process line variations. If the optimal deposition profile and the thickness is not provided, the combined deposition and CMP process will provide different material thicknesses within a wafer diameter, causing a strong variation within the wafer for device relevant product parameters.

The above problem is illustrated in FIGS. 1a-1b. FIG. 1a illustrates the case where the deposition profile does not match the inverse polish removal profile. In contrast thereto, FIG. 1b illustrates a case where the deposition profile matches with the inverse polish removal profile.

Back to FIG. 1a, a target profile is shown indicated by broken line 7. Line 1 illustrates the thickness of the deposited material before starting the polishing process (time 0). Line 2 illustrates the thickness of the deposited material at time 1 after the polishing process has been started. As can be seen, the profile mismatch becomes more distinctive when proceeding with the polishing process, i.e., the edges of the deposited material become sharper and the thickness inhomogeneity across the radius (−R to R) becomes larger. At the end of the polishing, indicated by line 3, only the edges of the deposited material meet the target thickness. In the central region of the deposited material, the thickness is too small.

In contrast thereto, FIG. 1b shows an optimal profile match between the deposition profile and the polishing profile. Line 4 shows the material thickness before starting the polishing process at time 0. Line 5 shows the material thickness after a certain time of polishing. As it can be seen, the thickness inhomogeneity has not become larger. At the end of the polishing process, the thickness of the deposited material, indicated by line 6, meets the target thickness indicated by broken line 7.

It is clear from FIG. 1 that devices in the middle of a wafer (radius 0) must have metal layer thicknesses that are significantly different than devices at the edge of a wafer (radius R). To the contrary, according to FIG. 1b, the thickness of the metal layer on the devices in the middle of the wafer is expected to be the same as in the edge region.

In order to avoid a mismatch between the deposition profile and the polishing profile, there are known so-called static solutions based on a given or assumed fixed CMP/polish removal profile in combination with a statically adjusted deposition profile. Alternatively, a static solution may be based on a fixed deposition shape like a defined bowl, dome or even for a flat profile within a wafer diameter in combination with a respectively adapted static removal profile.

These static methods are illustrated in FIGS. 2a-2b. FIG. 2a illustrates how a combined deposition/polishing process is set up and FIG. 2b illustrates carrying out the combined deposition/polishing production process.

Before a combined deposition/polishing process may be used for production of product wafers, appropriate tool settings have to be determined. Conventionally, this is done by running test wafers as illustrated in FIG. 2a. In FIG. 2a, a deposition tool 10 deposits a certain material on a test wafer using initial settings 11 for the deposition tool. Subsequently, a thickness profile of the deposited material may be measured in a profile measurement tool 15. Subsequently, excess material is removed in the polishing tool 13. On most enhanced CMP/polish tools there are endpoint systems available, which are illustrated in FIG. 2a as endpoint measurement tool 12. The endpoint measurement tool 12 determines the actual thickness profile of the remaining material of the layer currently polished. For choosing initial settings 14 of the polishing tool 13, the results of the profile measurement tool 15 may be used. If the endpoint measurement tool 12 results in a mismatch between the deposition profile and the polishing profile, it has to be decided as to whether adjusting the polishing tool settings 14 is sufficient to correct the mismatch. At the beginning of the process of finding appropriate tool settings, mostly the mismatch is too large such that it cannot be compensated for by the polishing tool alone. Therefore, adjusting the deposition tool settings 11 has to be considered as well. In this case, the endpoint measurement tool 12 provides a polishing profile and test wafer runs are carried out with successively changing the deposition tool settings 11 until the measurements taken by the profile measurement tool 15 indicate that the difference between the measured material thickness profile and the inverse polishing profile is smaller than a predetermined value. Fine adjustments may be carried out by modifying the polishing tool settings under the control of the endpoint measurement tool 12.

FIG. 2b shows the wafer flow and data flow under production conditions. The settings 11 and 14 for the deposition tool 10 and the polishing tool 13 are assumed to be given. The settings 11 for the deposition tool 10 will be fixed and smaller process fluctuations may be compensated for, for instance, by adjustment of the settings 14 of the polishing tool 13 due to the results of the endpoint measurement tool 12. The adjustment then becomes effective in the next wafer run. Since the deposition tool settings are treated fixed, this method is called a static method.

It has to be noted that the characterization of the process illustrated in FIGS. 2a-2b needs to be done individually per layer and product if there are significant differences in percentages of open areas, die sizes and wafer stepping. All these efforts lead to a consumption of a certain amount of wafers to find the right shaping, which adds costs and cycle time. The CMP process is very consumable dependent. Therefore, a one-time snapshot is not always relevant for the whole population of product wafers. Additionally, there may be an individual operator and/or engineering dependence variable associated with these processes. A further drawback of the static method is that the process fluctuations cannot be compensated for efficiently. For instance, the electrolyte concentration in the case of electrochemical deposition of copper may change with time, which leads to a change of the plating profile. Anodes or cathodes might corrode with time such that the plating settings become inadequate. Chemical mechanical polishing conditions may change due to deterioration of the tool characteristics. As a consequence, additional qualification runs of test wafers have to be carried out in order to re-adjust the tool settings, i.e., the deposition tool and the CMP tool.

In view of the global market forces to offer high quality products at low prices, it is thus important to improve yield and process efficiency to minimize production costs. In manufacturing modern integrated circuits, 500 or more individual processes may be necessary to complete the integrated circuit, wherein failure in a single process step may result in a loss of a complete integrated circuit. It is therefore crucial for manufacturing integrated circuits that each individual step reliably has the desired result requiring the least possible resources.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a method of automatic deposition profile targeting wherein thickness and profile measurements may be done within the chemical mechanical polishing process and therefore no additional measurement time is needed.

In particular, there is provided, in one illustrative embodiment, a method of automatic deposition profile targeting and control, comprising the steps of measuring, by a polishing endpoint measurement tool, a thickness profile of deposited material at a time t0 representing a beginning of a polishing process, defining a polishing start profile, which allows specifically removing deposited material from the polishing start profile to a predetermined polishing end profile, determining a difference between the measured thickness profile at time t0 and the polishing tool specific polishing start profile, feeding the difference to an advanced process control system, calculating an optimized deposition target profile and updating settings of a particular position-dependent controllable deposition tool.

According to another illustrative embodiment, there is provided a method of automatic deposition profile targeting and control, comprising the steps of measuring, by a polishing endpoint measurement tool, a thickness profile of deposited copper at a time t0 representing a beginning of a polishing process, defining a polishing start profile, which allows specifically removing deposited copper from the polishing start profile to a predetermined polishing end profile, carrying out successive thickness measurements from the start of polishing until the end of polishing, determining the thickness difference versus radius between thickness measurements at times t1 and t0, t2 and t1, t3 and t2 until times tn and tn−1, calculating removal rate versus time and radius and absolute removal versus radius, feeding the results to an advanced process control system, calculating by the advanced process control at least one of optimized polishing settings, an optimized polishing start profile and corresponding deposition targets, and updating at least one of the settings of the particular position-dependent controllable electromechanical deposition tool and settings of a chemical mechanical polishing tool.

In yet another illustrative embodiment, there is provided a combined deposition/polishing apparatus with an advanced endpoint system comprising a polishing tool, a polishing endpoint measurement tool, a position-dependent controllable deposition tool and a controller connected with the polishing tool, the polishing endpoint measurement tool and the position-dependent controllable deposition tool, wherein advanced process control models are implemented for optimizing the combined deposition polishing process.

BRIEF DESCRIPTION OF THE DRAWINGS

The disclosure may be understood by reference to the following description taken in conjunction with the accompanying drawings, in which like reference numerals identify like elements, and in which.

Figure 1B:
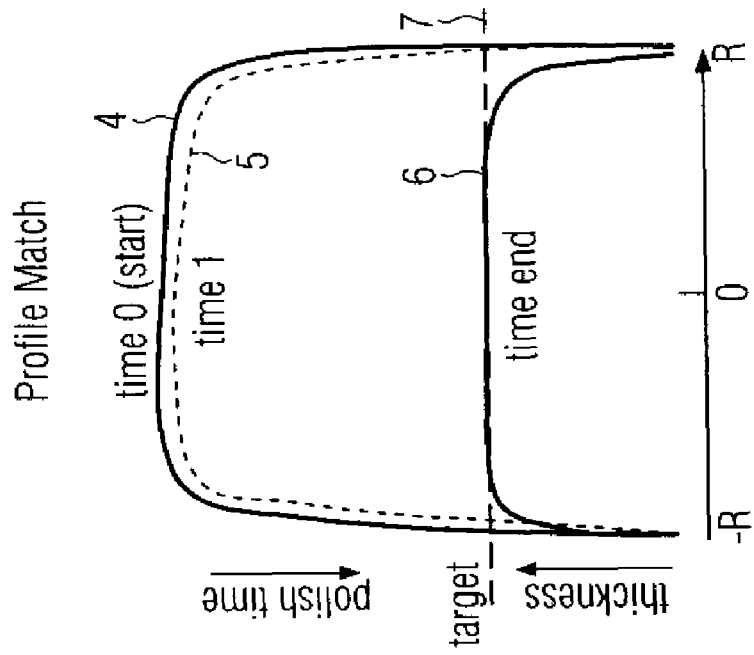
FIG. 1b illustrates an optimal profile match between a deposition tool and a polishing tool.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It is to be noted that the detailed description will mainly refer to electroplating of copper on substrates such as those typically used in semiconductor fabrication, since the present disclosure is particularly useful in a process sequence with sensitive post-plating processes, such as chemical mechanical polishing (CMP). It will be readily appreciated, however, that the present disclosure is applicable to any deposition tool that allows influencing the thickness distribution. Moreover, the present disclosure is applicable to any polishing tool that includes an enhanced endpoint system.

Figure 1A:
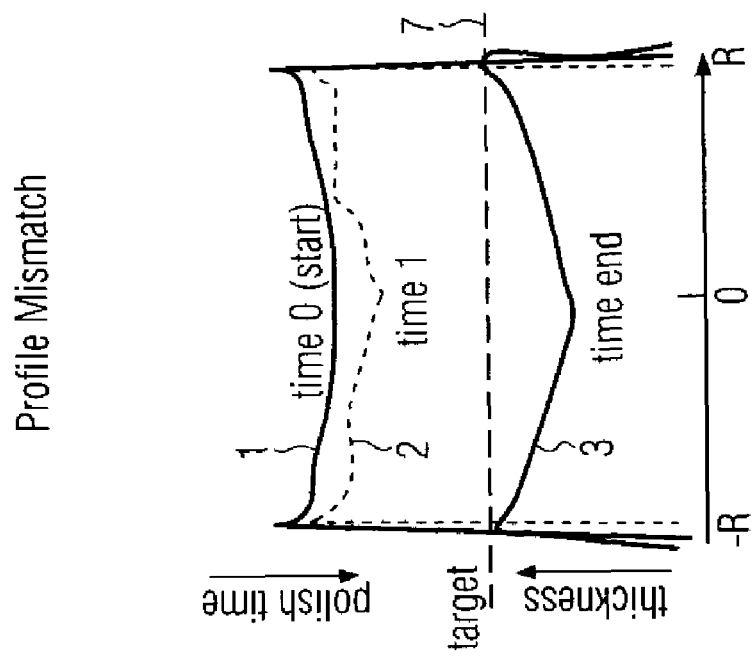
FIG. 1a illustrates a profile mismatch between a deposition tool and a polishing tool.
Figure 2A:
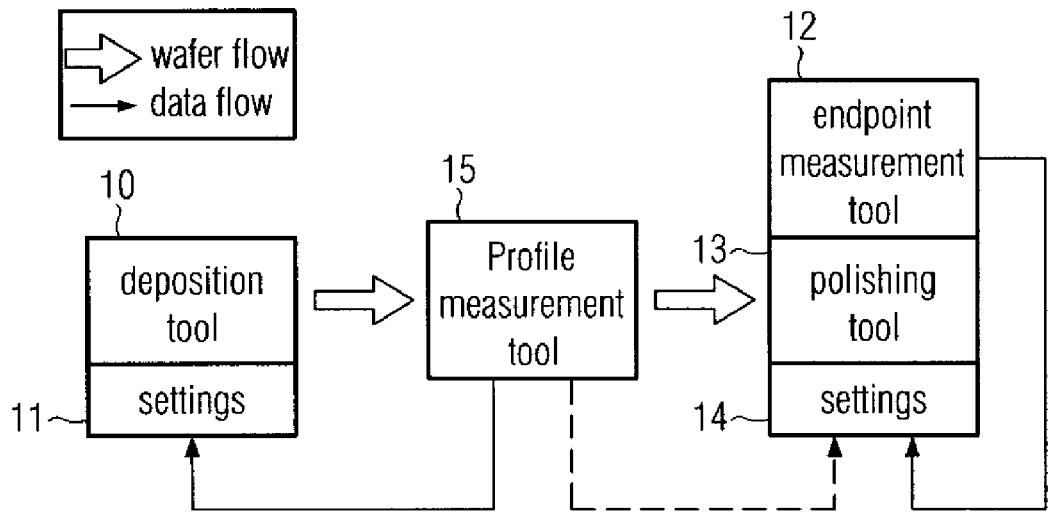
FIG. 2a illustrates a method of finding tool settings according to the prior art.
Figure 2B:
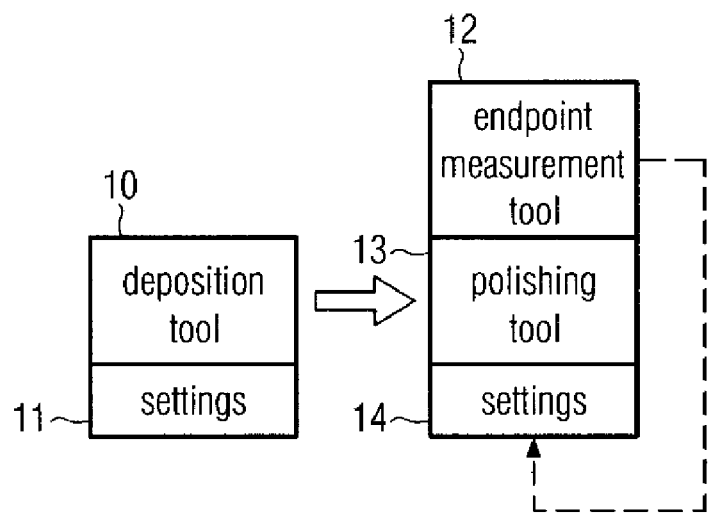
FIG. 2b illustrates the processing of a product wafer according to the prior art.

The endpoint system determines the actual thickness of the remaining material of the layer currently polished. For transparent layers, this may be achieved by spectrographic or interferometric optical systems, and for metallic films like copper and tungsten, eddy current systems are applicable. These systems are used to compare the actual data output with a given target output signal. Enhanced systems may also provide a signal showing the absolute or relative thickness of the currently machined surface layer versus radius and also versus actual process time. This disclosure suggests using these enhanced polishing endpoint systems to find and correct the targets for the optimized profile and the thickness of the deposited layer individually for each product/layer combination based on the various situations depicted in FIGS. 1a-1b. All measurement data will be gathered from the endpoint system while processing the wafer on the CMP/polish tool. The profile and thickness data will be used in an advanced process control (APC) system for calculating and optimizing the settings for the deposition tool to achieve the best inverse profile adequate to the CMP/polish removal profile. These settings will be applied to the next wafer process run.

Figure 3:
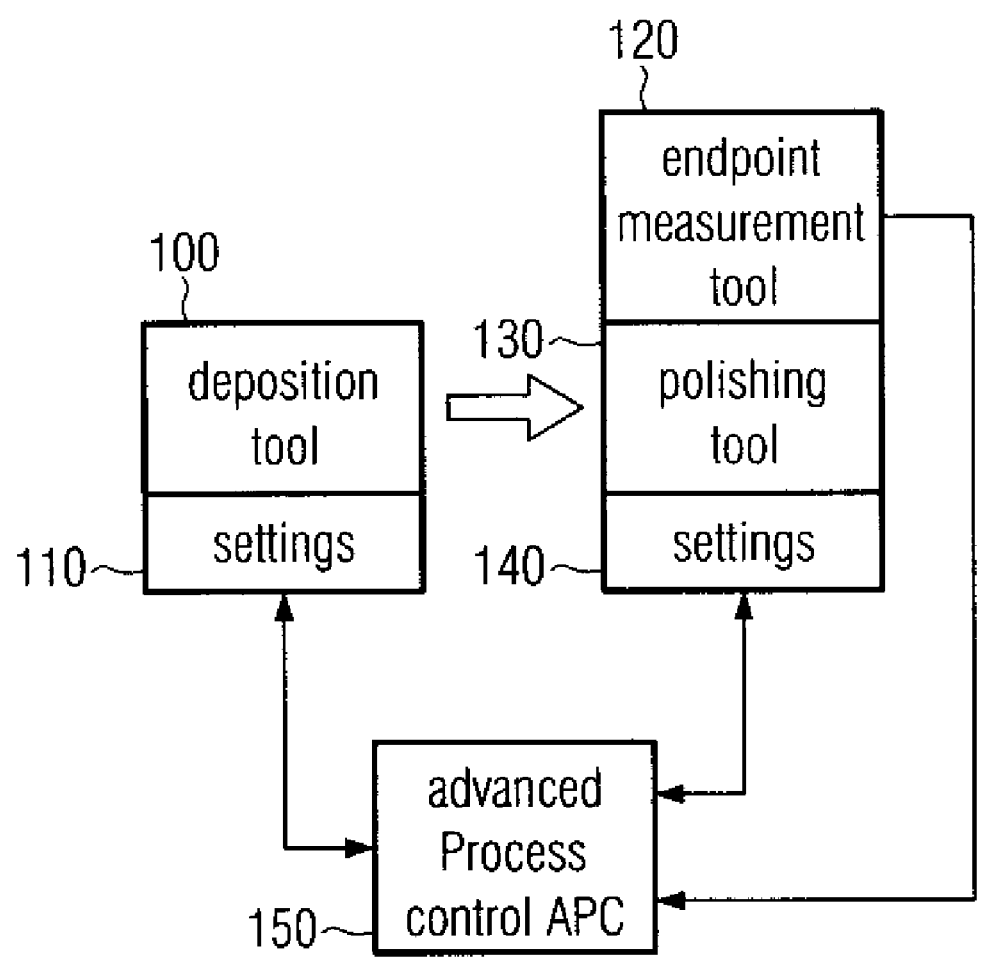
FIG. 3 illustrates the method and the apparatus according to the present disclosure.

This is exemplified in FIG. 3. FIG. 3 illustrates the combined deposition/polishing system according to the present disclosure. Reference numeral 100 denotes a deposition tool that allows position-dependent depositing of materials on a substrate. That is, position tool 100 allows providing a predetermined thickness profile of deposited materials. In case of electrochemical deposition of, for instance, copper, the deposition tool may be a typical conventional electroplating system including a reactor vessel with a plurality of individually drivable anode portions thereby defining a multiple anode configuration. The deposition tool 100 may be a so-called fountain-type reactor, in which an electrolyte solution is directed from the bottom of the reactor vessel to the top side and is then re-circulated by a pipe connecting an outlet with a storage tank, which in turn is connected to an inlet provided as a passage through the anode. The electroplating system may further comprise a substrate holder that is configured to support a substrate, such as the current product wafer, to expose a surface of interest to the electrolyte. Moreover, the substrate holder may be configured to connect as a cathode. In a typical configuration, a thin current distribution layer, typically provided by sputter deposition, is formed on the surface of the substrate that will receive the metal layer. After mounting the substrate on the substrate holder and connecting the current distribution layer with a power source via the substrate holder, an electrolyte flow is created within the reactor vessel by activating a pump. By applying appropriate voltages between the multiple anode configuration and the cathode, copper is deposited on the product wafer depending on the respective currents between the cathode and each of the plurality of anode portions. The deposition of metal on the substrate is determined by the flow of electrolyte and the arrangement of the multiple anode configuration, since the local deposition rate of metal on a specific area of a surface of the substrate depends on the number of ions arriving at this area. The result in thickness profile is determined not only by the individual currents flowing through any one of the plurality of anodes, but is also determined by the characteristics of the reactor vessel, the electrolyte solution and the characteristics of the wafer itself.

It has to be noted that the electroplating system is only an example for a position-dependent controllable deposition tool. A position-dependent control of the deposition may also be achieved by, for instance, adjustable masks (i.e., an iris aperture in a sputtering apparatus). Therefore, the present disclosure is not limited to a particular deposition tool but may be applied to any deposition tool which has control over the thickness profile of deposited material.

Reference numeral 110 represents a plurality of parameters that may be stored, for instance, in a memory device included in the deposition tool 100 which enable the deposition tool to provide a particular deposition profile. The memory device containing the tool settings 110 may be integrated in the deposition tool 100 or may be provided externally.

Reference numeral 130 denotes a CMP/polish tool that has integrated or attached an endpoint measurement tool 120 which can measure the thickness profile of the deposited material. For conductive metallic films like copper and tungsten, eddy current systems are applicable. For transparent dielectric layers, spectrographic or interferometric optical measurement systems may be used. Preferably, advanced endpoint systems are used which can compare their actual measurement data output with a given target output signal. The endpoint system may also be used to apply rules as to whether the compared signals are equal, i.e., the differences are substantially zero, differences become smaller or larger with polishing time, signals have a particular slope or shape, etc. Such enhanced endpoint systems may also provide a signal showing the absolute or relative thickness of the currently machined surface layer versus radius and also versus actual process time.

Reference numeral 140 denotes a set of parameters representing the settings of the polishing tool 130, which produces a particular polishing profile. Similar to the deposition tool settings 110, the polishing tool settings 140 may be stored in a memory device which may be integrated in the polishing tool 130 or may be external.

Reference numeral 150 illustrates an advanced process control (APC) module that controls the combined deposition/polishing process. The APC module 150 includes models that can predict deposition behavior and polishing behavior based on measurement data, tool parameters and product parameters. The APC model 150 further may optimize tool settings in order to achieve a predetermined profile of a deposited material.

One particular feature of this disclosure is that the advanced polishing endpoint measurement tool 120 measures thickness profiles of deposited materials before, during and at the end of removing excess deposited material, and that this measurement data is fed to the APC 150. Based upon this measurement data, the APC 150 modifies or calculates new settings 110 and/or 140 for at least one of the deposition tool 100 and the polishing tool 130 on the basis of an advanced process control (APC) model in order to compensate for production line fluctuations due to wear and change of consumable status or in order to find a new parameter set for the deposition tool 100 and the polishing tool 130 in case of new products.

Basically, the system illustrated in FIG. 3 has at least two possible types of usage:

Type 1: The endpoint data from time 0 (start of polishing) is collected. Next, a polishing tool 130 with known properties including a set of polishing parameters is selected, whereby a polishing start profile is defined. The difference between the deposition profile and the polish start profile is calculated and fed to the APC model, which optimizes deposition tool 100 settings 110, thus providing an advanced polish endpoint feedback.

Type 2: All endpoint data from time 0 (start of polishing) until the end of polishing is collected. From this data, the removable rate versus time and radius and the absolute removal versus radius is determined and fed to the APC model. The APC calculates optimized tool settings 110, 140 for the deposition tool 100 and the polishing tool 130.

The two types of usage are explained in more detail with reference to FIGS. 4 and 5.

Figure 4:
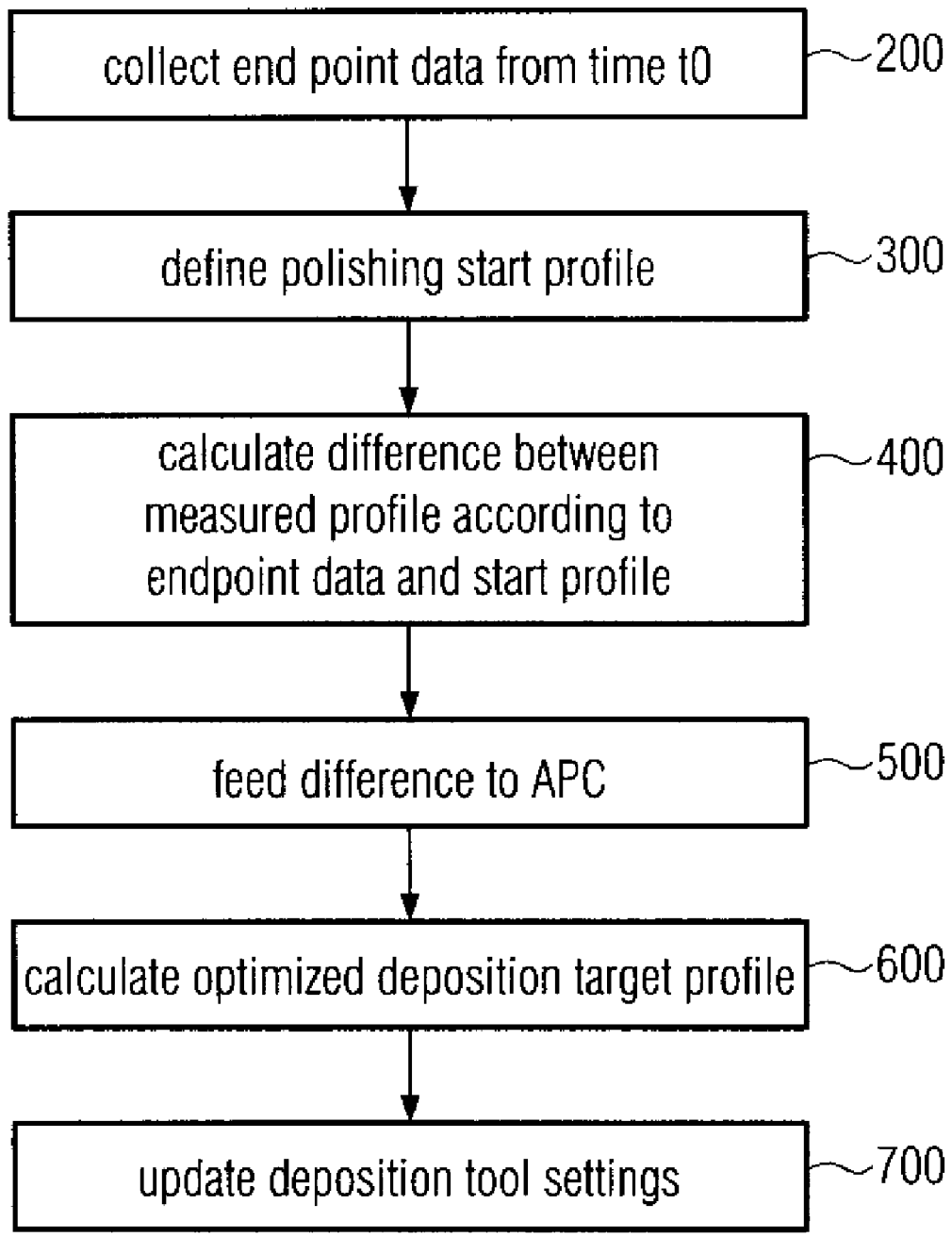
FIG. 4 illustrates a flowchart of the method steps according to a first illustrative embodiment of the present disclosure.
Figure 5:
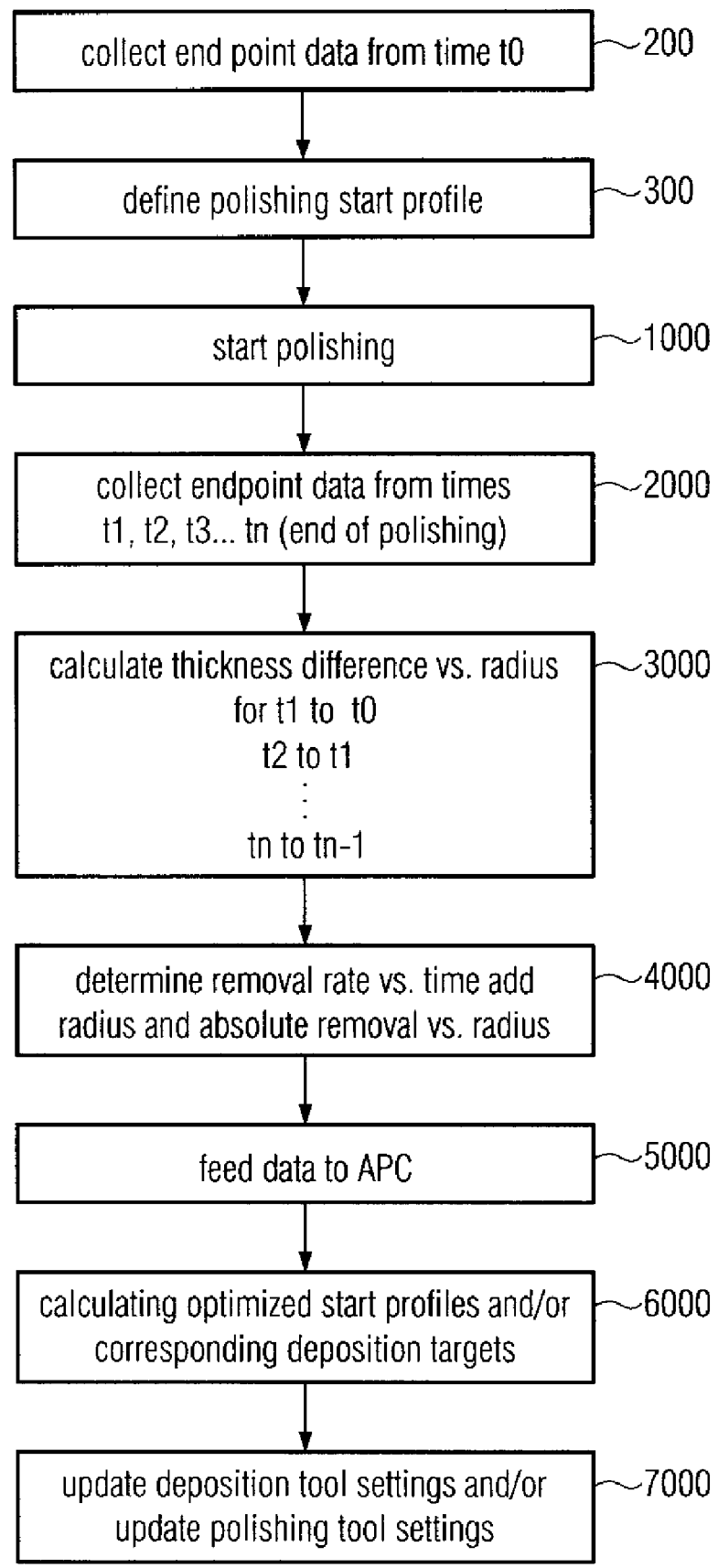
FIG. 5 illustrates a flowchart of the method steps according to a second illustrative embodiment of the present disclosure.

FIG. 4 illustrates the method steps of Type 1 of usage of the combined deposition/polishing apparatus with advanced endpoint system. According to FIG. 4, in a first step 200, endpoint data from the endpoint measurement tool 120 is collected at time t0 at the beginning of polishing or before the beginning of polishing. The collected endpoint data represent the thickness profile of a deposited material after the deposition process has been finalized.

The first step 200 may also include two or more successive measurements for data averaging and noise reduction. This improves the stability of the APC algorithms and leads to faster tuning of the process.

In the next step 300, a polishing start profile is defined. For this purpose, the endpoint data is compared with data from a database, which represents a polishing tool behavior with different settings. This data base may be structured in a way that any set of polishing tool parameters may be related with a particular start profile. The start profile indicates that profile which is polished to a predetermined structure, e.g., a flat structure, after a predetermined polishing time. Defining a polishing start profile, as indicated in step 300, means that a start profile with corresponding tool settings is selected from the database which matches as far as possible with the collected endpoint data from time t0 representing the thickness profile of the deposited material. This may be done by summing up all differences between the measured data and the stored start profile data and choosing the start profile having the smallest sum of differences. Statistical methods may, however, also be used, such as least square methods.

In the next step 400, a difference between the measured profile according to the endpoint data and the start profile is calculated and subsequently fed to the APC (step 500). In the next step 600, the APC calculates an optimized deposition target profile that has a better match with the start profile. This will lead to a new set of deposition tool 100 parameter settings 110. In the final step 700, the deposition tool settings 110 are updated such that the optimized combined deposition/polishing process becomes effective with the following wafer run.

After a polishing start profile has been defined in step 300, there may also follow a plurality of successive endpoint measurements during the polishing process until the end of polishing process. Thus, a removal rate versus time and radius as well as an absolute removal versus radius may be determined and fed to the APC. In this case, the APC has more data for calculating optimized start profiles and/or corresponding deposition targets including corresponding tool settings. A further advantage is that the APC also gets information about the removal process itself and can better adjust the parameter settings of the combined deposition/polishing process. Furthermore, it is possible to use successive endpoint tool setting measurements for data averaging and noise reduction.

In order to enable the APC for efficiently optimizing the complete process, the APC must include different models in order to appropriately optimize tool settings. For instance, the APC system includes a model of a dependency between a deposition profile target and the polishing tool characteristics and the polishing tool history. That means that, even in the case that the deposition profile is constant, the polishing characteristic changes due to change of consumable status and the wear of the polishing equipment. This has to be compensated for, for instance, by changing the deposition profile target. The same may be applied the other way around. Even if the polishing characteristics stay constant, the deposition profile may change due to a change of the consumable status and the wear of the deposition tool, which may be compensated for, for instance, by changing the polishing settings and/or changing the deposition profile target.

Furthermore, a model of a dependency between a deposition profile and underlying structures on a substrate may be useful to appropriately modify tool settings in order to achieve a match between the deposition profile and the polishing profile. For instance, the product may change such that the patterns on the new product wafer, like trenches, and their width and depth are different than that of the preceding product wafer. This may influence the electrical field that is necessary for a plating process. Therefore, the same deposition tool settings may lead to a different deposition profile, which has to be compensated for by changing either the deposition tool settings or the polishing tool settings or both.

Further parameters that may be included in the APC model may be pattern density, etch depth, trench width, wafer stepping, material and crystal orientation of underlying materials, flow geometry of the electrolyte, consumable status like concentration of electrolyte, electrode condition such as electrode history and corrosion. By use of these models, the APC can predict a deposition behavior and/or a polishing behavior and can optimize combined deposition/polishing settings.

According to Type 2 of the usage of the apparatus illustrated in FIG. 3, a more precise and flexible automatic adjustment of tool settings may be achieved. As illustrated in FIG. 5, the first step 200 and the second step 300 are identical to that illustrated in FIG. 4. After the second step 300, polishing is started 1000. Subsequently, endpoint data is collected from times t1, t2, t3 until tn which is the end of polishing (2000). Then, thickness differences versus radius is calculated for t1 and t0, t2 and t1, ... until tn and tn−1 (3000). The removal rate versus time and radius is determined as well as the absolute removal versus radius (4000). These data are fed to the APC which calculates optimized start profiles and corresponding deposition targets (6000). Finally, deposition tool settings and polishing tool settings are updated (7000). The advantage of this method is that more accurate settings are possible because the APC optimizes the deposition tool settings in combination with the polishing tool settings.

In conclusion, the present disclosure provides a technique that carries out thickness and profile measurement within the polishing process. Measurement data from all processed wafers are available and may be included in the feedback model. In contrast to conventional metrology sampling strategy, this allows 100% of wafers to be measured while reducing cycle time and investment costs, because measurement steps between deposition and polishing may be reduced. Additionally, there are manpower and setup time advantages because no extra metrology is necessary. The use of the polish endpoint system does not add any extra costs to a setup based on this disclosure, because it must be purchased anyway for the classical endpointing of processed wafers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of automatic deposition profile targeting and control, comprising the steps of:
   measuring by a polishing endpoint measurement tool a thickness profile of a deposited layer of material at a time t0 representing a beginning of a polishing process;
   selecting a polishing tool with known properties including a set of polishing parameters, thereby defining a polishing start profile;
   determining a difference between the measured thickness profile at time t0 and the polishing tool specific polishing start profile;
   feeding the difference to an advanced process control (APC) system;
   calculating an optimized deposition target profile based upon at least said difference and
   updating settings of a particular position-dependent controllable deposition tool based upon at least said optimized deposition target profile.

2. The method of claim 1, wherein the step of selecting a polishing tool further comprises selecting a set of parameters for said polishing tool from a database such that a profile difference between the selected polishing start profile and the measured thickness profile at time t0 becomes minimal.

3. The method of claim 1, wherein the step of measuring said thickness profile of deposited material at a time t0 further comprises at least two successive measurements for averaging and noise reduction.

4. The method of claim 1, further comprising the steps of:
   carrying out n successive thickness measurements after the step of defining said polishing start profile until the end of polishing;
   determining the thickness difference versus radius between thickness measurements at times t1 and t0, t2 and t1 , t3 and t2 until times to and tn−1;
   calculating removal rate versus time and radius and absolute removal versus radius;
   feeding said calculated removal rate versus time and radius and said calculated absolute removal versus radius to the APC; and
   calculating by the APC at least one of optimized polish settings, an optimized polishing start profile and corresponding deposition targets.

5. The method of claim 4, wherein the step of carrying out n successive thickness measurements includes averaging of at least two successive measurements for noise reduction.

6. The method of claim 2, wherein minimizing of said profile difference is calculated by a least square method.

7. The method of claim 1, wherein the APC system includes at least one of a model of a dependency between a deposition profile target and polishing tool characteristics, a model of a dependency between a deposition profile and underlying structures and a model of a dependency between a deposition profile and plating tool characteristics, wherein the APC models predict at least one of a deposition behavior and a polishing behavior based on these models and optimizes combined deposition/polishing settings.

8. A method of automatic deposition profile targeting and control, comprising the steps of:

measuring by a polishing endpoint measurement tool a thickness profile of deposited copper at a time t0 representing a beginning of a polishing process;

selecting a polishing tool with known properties including a set of polishing parameters, thereby defining a polishing start profile;

carrying out n successive thickness measurements after begin of polishing until the end of polishing;

determining the thickness difference versus radius between thickness measurements at times t1 and t0, t2 and t1, t3 and t2 until times to and tn−1;

calculating removal rate versus time and radius and absolute removal versus radius;

feeding said calculated removal rate versus time and radius and said calculated absolute removal versus radius to an advanced process control (APC) system;

calculating by the APC at least one of a polish setting, a polishing start profile and a deposition target; and updating at least one of the settings of a particular position-dependent controllable electrochemical deposition (ECD) tool and settings of a chemical mechanical polishing (CMP) tool.

9. The method of claim 8, further comprising the steps of :

determining a difference between the measured thickness profile at time t0 and the polishing tool specific polishing start profile;

feeding the difference to the APC system;

calculating an optimized deposition target profile; and updating the settings of the ECD tool.

10. The method of claim 8, wherein the step of selecting a polishing tool further comprises selecting a set of parameters for said polishing tool from a database such that a profile difference between the selected polishing start profile and the measured thickness profile at time t0 becomes minimal.

11. The method of claim 8, wherein the step of measuring said thickness profile of deposited material at a time t0 further comprises at least two successive measurements for averaging and noise reduction.

12. The method of claim 8, wherein the step of carrying out n successive thickness measurements includes averaging of at least two successive measurements for noise reduction.

13. The method of claim 10, wherein minimizing of said profile difference is calculated by a least square method.

14. The method of claim 8, wherein the APC system includes at least one of a model of a dependency between a deposition profile target and polishing tool characteristics, a model of a dependency between a deposition profile and underlying structures and a model of a dependency between a deposition profile and plating tool characteristics, wherein the APC models predict at least one of a deposition behavior and a polishing behavior based on these models and optimizes combined deposition/polishing settings.

15. A combined deposition/polishing apparatus with an advanced endpoint system, comprising:

a polishing tool;

a polishing endpoint measurement tool;

a position-dependent controllable deposition tool; and a controller connected with each of said polishing tool, said polishing endpoint measurement tool and said position-dependent controllable deposition tool, wherein said controller is adapted to implement advanced process control (APC) models for optimizing a combined deposition/polishing process, said APC models comprising at least one of a model of a dependency between a deposition profile target and polishing tool characteristics, a model of a dependency between a deposition profile and underlying structures, and a model of a dependency between a deposition profile and plating tool characteristics, wherein said APC models predict at least one of a plating behavior and a polishing behavior based on said models and optimizes combined deposition/polishing settings.

16. The apparatus of claim 15, wherein said polishing endpoint measurement tool comprises at least one of a spectrographic optical system and an interferometric optical system, and the deposition tool is adapted to deposit a dielectric material that is transparent to measurement light on a position-dependent basis.

17. The apparatus of claim 15, wherein said polishing endpoint measurement tool comprises an eddy current measurement system, and said deposition tool is adapted to deposit a conductive material on a position-dependent basis.

18. The apparatus of claim 17, wherein said deposition tool is an electrochemical deposition tool using multi-anode configuration and said conductive material comprises copper.

* * * * *

UNITED STATES PATENT AND TRADEMARK OFFICE
CERTIFICATE OF CORRECTION

PATENT NO. : 7,899,570 B2  
APPLICATION NO. : 12/038327  
DATED : March 1, 2011  
INVENTOR(S) : Thomas Ortleb, Markus Nopper and Thomas Roessler Page 1 of 1

It is certified that error appears in the above-identified patent and that said Letters Patent is hereby corrected as shown below:

Col. 10, line 52 (claim 4, line 7), delete "to" and insert therefor -- tn --.

Col. 11, line 20 (claim 8, line 13), delete "to" and insert therefor -- tn --.

Signed and Sealed this  
Twelfth Day of April, 2011

David J. Kappos  
*Director of the United States Patent and Trademark Office*